(12) United States Patent
Zhuang et al.

(10) Patent No.: US 6,664,117 B2
(45) Date of Patent: Dec. 16, 2003

(54) METHOD FOR RESISTANCE MEMORY METAL OXIDE THIN FILM DEPOSITION

(75) Inventors: Wei-Wei Zhuang, Vancouver, WA (US); Sheng Teng Hsu, Camas, WA (US); Jong-Jan Lee, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 5 days.

(21) Appl. No.: 10/256,380

(22) Filed: Sep. 26, 2002

(65) Prior Publication Data

US 2003/0148546 A1 Aug. 7, 2003

Related U.S. Application Data

(63) Continuation-in-part of application No. 10/072,225, filed on Feb. 7, 2002.

(51) Int. Cl.$^7$ .............................................. H01L 21/00
(52) U.S. Cl. ..................... 438/3; 257/295; 117/947; 502/525; 438/781; 438/782
(58) Field of Search .............. 257/295, 75; 438/385, 438/3, 763, 780–782; 427/453, 498, 537, 404, 576, 584, 249.19, 250, 422; 117/944–950; 502/506, 525

(56) References Cited

U.S. PATENT DOCUMENTS

| 4,946,710 A | * | 8/1990 | Miller et al. ............ 427/126.3 |
| 4,963,390 A | * | 10/1990 | Lipeles et al. .............. 427/110 |
| 5,188,902 A | * | 2/1993 | Lin ........................... 428/426 |
| 5,271,955 A | * | 12/1993 | Maniar ...................... 427/100 |
| 5,342,648 A | * | 8/1994 | MacKenzie et al. ..... 427/126.3 |
| 5,384,294 A | * | 1/1995 | Teowee et al. ............ 501/134 |
| 5,656,382 A | * | 8/1997 | Nashimoto .................. 428/620 |
| 5,699,035 A | * | 12/1997 | Ito et al. ...................... 338/21 |
| 6,066,581 A | * | 5/2000 | Chivukula et al. ............ 501/12 |
| 6,204,139 B1 | | 3/2001 | Liu et al. |

FOREIGN PATENT DOCUMENTS

| EP | 489519 | * | 6/1992 | ......... H01L/21/314 |
| WO | WO-90 13149 | * | 11/1990 | ........... H01L/41/24 |

OTHER PUBLICATIONS

Liu et al., *Electric-pulse-induced reversible resistance change effect in magnetoresistive films*, Applied Physics Letters, vol. 76, No. 19; May 8, 2000, pp 2749–2751.

* cited by examiner

Primary Examiner—Matthew Smith
Assistant Examiner—Calvin Lee
(74) Attorney, Agent, or Firm—David C. Ripma; Matthew D. Rabdau; Scott C. Krieger

(57) ABSTRACT

A method of forming a multi-layered, spin-coated perovskite thin film on a wafer includes preparing a perovskite precursor solution including mixing solid precursor material into acetic acid forming a mixed solution; heating the mixed solution in air for between about one hour to six hours; and filtering the solution when cooled; placing a wafer in a spin-coating mechanism; spinning the wafer at a speed of between about 500 rpm to 3500 rpm; injecting the precursor solution onto the wafer surface; baking the coated wafer at a temperature of between about 100° C. to 300° C.; annealing the coated wafer at a temperature of between about 400° C. to 650° C. in an oxygen atmosphere for between about two minutes to ten minutes; repeating the spinning, injecting, baking and annealing steps until a perovskite thin film of desired thickness is obtained; and annealing the perovskite thin film at a temperature of between about 500° C. to 750° C. in an oxygen atmosphere for between about ten minutes to two hours.

5 Claims, 2 Drawing Sheets

METHOD FOR RESISTANCE MEMORY METAL OXIDE THIN FILM DEPOSITION

RELATED APPLICATIONS

This Application is a continuation-in-part of Ser. No. 10/072,225, filed Feb. 7, 2002, or Device and method for reversible resistance change induced by electric pulses in non-crystalline perovskite unipolar programmable memory, which is incorporated herein by reference, and is related to Ser. No. 10/256,358, filed Sep. 26, 2003, for Method for resistance switch using short electric pulses.

FIELD OF THE INVENTION

This invention relates to the preparation of a resistance memory using metal oxide thin films, and specifically to a form of non-volatile memory device which incorporates an electric-pulse induced reversible resistance change as a memory element in a non-volatile cross point electrically programmable RAM array.

BACKGROUND OF THE INVENTION

The $Pr_{0.7}Ca_{0.3}MnO_3$ (PCMO) metal oxide thin films demonstrate reversible resistance change via applying electric pulse, were grown on both epitaxial $YBa_2Cu_3O_7$ (YBCO) and partial epitaxial Pt substrates via pulsed laser ablation (PLA) technique, as described by Liu et al., Electric-pulse-induced reversible resistance change effect in magnetoresistive films, Applied Physics Letters, 76, 2749, 2000; and Liu et al., U.S. Pat. No. 6,204,139, granted Mar. 20, 2001, for Method of switching the properties of perovskite materials used in thin film resistors. X-Ray diffraction (XRD) polar figures confirm the epitaxial properties of PCMO thin films.

U.S. Pat. No. 6,204,139 describes the resistance change which occurred when electric pulses are applied at room temperature to PCMO thin films. The PCMO thin films were deposited on both epitaxial YBCO and partial epitaxial Pt substrates by pulsed laser deposition (PLD). In the '139 reference, the polarity of the electric pulse determined the character of the resistance change, i.e., increase or decrease.

An electrically programmable resistance, non-volatile memory device, operable at room temperature, was made of PCMO epitaxially grown on YBCO on $LaAlO_3$, as published by Liu et al. This type of memory may be reversibly programmed by a reversed short electrical pulse, or, as described in the above-identified related Application, by application of electrical pulses of varying length, regardless of polarity. The memory cell is able to produce either single bit or multi-bit information. However, the PCMO must be in crystalline form, which requires that the PCMO must be grown on a specific bottom electrode, such as YBCO, which is not compatible to the state-of-the-art silicon integrated circuit technology. The growth, or crystallization, temperature is relatively high, e.g., >700° C., which makes integration of the device into state-of-the-art integrated circuit very complex. In addition, it is not possible to cover the full circuit area with a single grain of PCMO. As the properties of a memory cell which is fabricated on a single grain PCMO crystal and the properties of a memory cell which is fabricated on a multi-grain PCMO crystal, which covers the grain boundary area, are not the same, circuit yield and memory performance problems will occur.

SUMMARY OF THE INVENTION

A method of forming a multi-layered, spin-coated perovskite thin film on a wafer includes preparing a precursor solution comprising: mixing solid precursor material into acetic acid forming a mixed solution; heating the mixed solution in air for between about one hour to six hours; filtering the solution when cooled; placing a wafer in a spin-coating mechanism; spinning the wafer at a speed of between about 500 rpm to 3500 rpm; injecting the precursor solution onto the wafer surface; baking the coated wafer at a temperature of between about 100° C. to 300° C.; annealing the coated wafer at a temperature of between about 400° C. to 650° C. in an oxygen atmosphere for between about two minutes to ten minutes; repeating the spinning, injecting, baking and annealing steps until a perovskite thin film of desired thickness is obtained; depositing a top electrode on the thin film; and annealing the perovskite thin film at a temperature of between about 500° C. to 750° C. in an oxygen atmosphere for between about ten minutes to two hours.

It is an object of the invention to provide a multi-layered, spin-coated PCMO thin film for use in non-volatile memory devices.

Another object of the invention is to provide a precursor solution suitable for PCMO spin-coating.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

Spin-coating technology is used for the deposition of $Pr_{0.7}Ca_{0.3}MnO_3$CMO) thin films. These thin films exhibit high reversible resistance changes when electric pulses are applied. Compared to the prior art of pulsed laser deposition (PLD) technology, which cannot be used for the thin film deposition on six-inch wafers, the spin-coating process of the method of the invention is suitable as a thin film deposition method for commercial IC fabrication.

The invention includes the use of metal oxide composition, precursors and the method for the thin film deposition via spin-coating process. The R-RAM metal oxide composition has a general formula of $M'_x M''_{(1-x)} M_y O_z$, wherein:

M': may be La, Ce, Pr, Nd, Pm, Sm Y, Sc, Yb, Lu, Gd;

M": may be Mg, Ca, Sr, Ba, Pb, Zn, Cd;

M: may be Mn, Ce, V, Fe, Co, Nb, Ta, Cr, Mo, W, Zr, Hf, Ni;

x: ranges from 0 to 1;

y: ranges from 0 to 2; and z: ranges from 1 to 7

The precursors for the spin-coating process are metal acetate or metal acetate hydrate, having the formulae: $M^o(CH_3CO_2)_u$, where:

$M^o$ may be La, Ce, Pr, Nd, Pm, Sm Y, Sc, Yb, Lu, Gd, Mg, Ca, Sr, Ba, Pb, Zn, Cd, Mn, Ce, Fe, Co, Cr, Mo, Zr, Hf and Ni; and u ranges from 2 to 4; and $M^o(CH_3CO_2)_v \cdot xH_2O$, where:
  $M^o$ may be La, Ce, Pr, Nd, Pm, Sm Y, Sc, Yb, Lu, Gd, Mg, Ca, Sr, Ba, Pb, Zn, Cd, Mn, Ce, Fe, Co, Cr, Mo, Zr, Hf and Ni; and
  v ranges between 2 to 4; and
  x ranges between 1 to 4.

The liquid precursor solutions are prepared by dissolving solid precursors in organic hydrocarbon solvents. The organic hydrocarbon solvents are required to have the following properties:

1. they must not to react with the solid precursors;
2. they must provide high solubility for the solid precursors; and
3. they must remain stable over a long time period with the solid precursor in solution. An examples of an organic hydrocarbon solvent having such properties is acetic acid.

Figure 1:
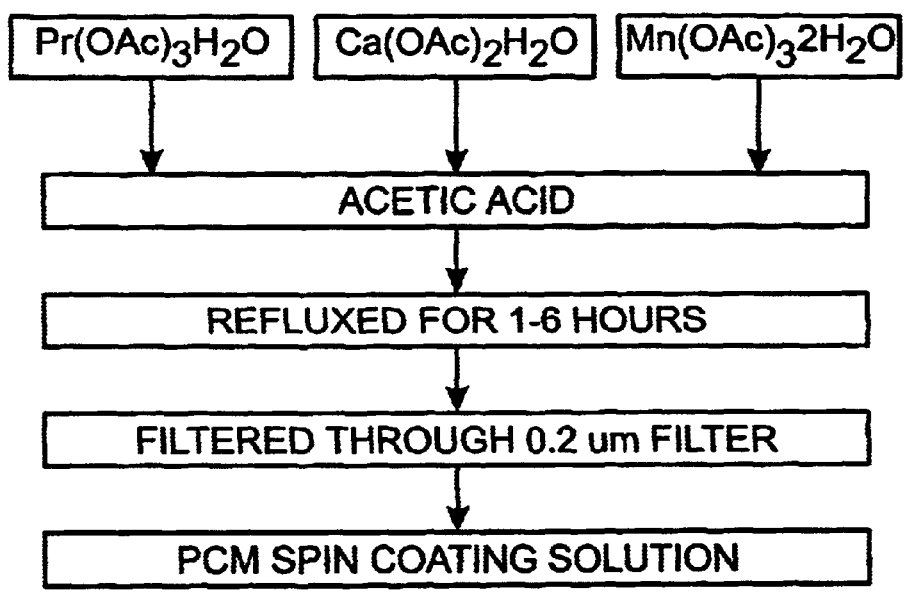
FIG. 1 is a block diagram depicting the method of the invention for the synthesis of a PCMO spin-coating solution.

An example of the method of the invention for the synthesis of PCMO spin-coating precursor solution is depicted in FIG. 1. The starting materials include $Pr(CH_3CO_2)_3 \cdot H_2O$, $Ca(CH_3CO_2)_2 \cdot H_2O$ and $Mn(III)(CH_3CO_2)_3 \cdot 2H_2O$. The solvent used is acetic acid. The stoichiometrical calculated three chemicals are mixed into acetic acid, and then refluxed, or heated, in air for between about one hour to six hours. A deep brown solution results, and is filtered through a 0.2 μm filter when cooled. After filtration, the solution may be used for the deposition of PCMO thin films via spin-coating.

For each layer of spin-coated PCMO, the PCMO precursor solution is injected onto the wafer surface which wafer is placed in a chuck in a spin-coating mechanism. The spin-coating speed ranges from between about 500 rpm to 3500 rpm. Each layer is baked at a temperature ranging from between about 100° C. to 300° C., and is then annealed at a temperature ranging from between about 400° C. to 650° C. for between about two minutes to ten minutes in an oxygen atmosphere. The final PCMO thin films includes two to six layers of PCMO resulting from spin-coating using a 0.5 N PCMO precursor solution. A final annealing temperatures range from between about 500° C. to 750° C. for between about ten minutes to two hours in an oxygen atmosphere. Pt or Ir may be used as bottom and/or top electrodes.

Figure 2:
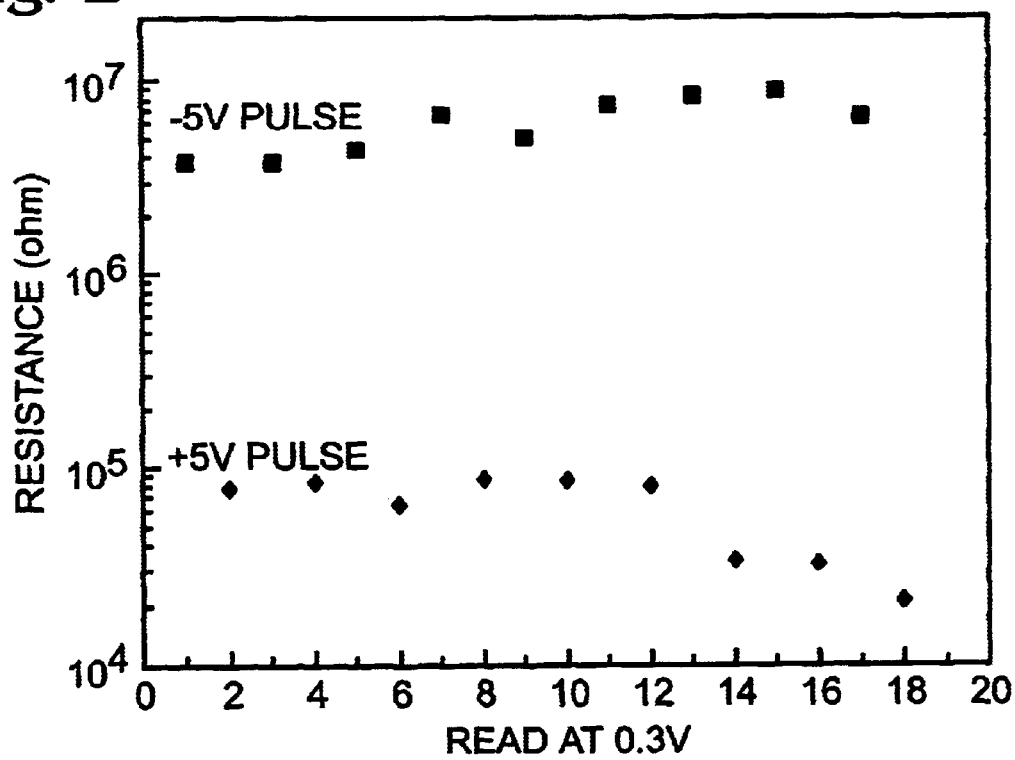
FIG. 2 depicts the reversible resistance change under +5V and −5V electric pulse actions of a device constructed according to the method of the invention.
Figure 3:
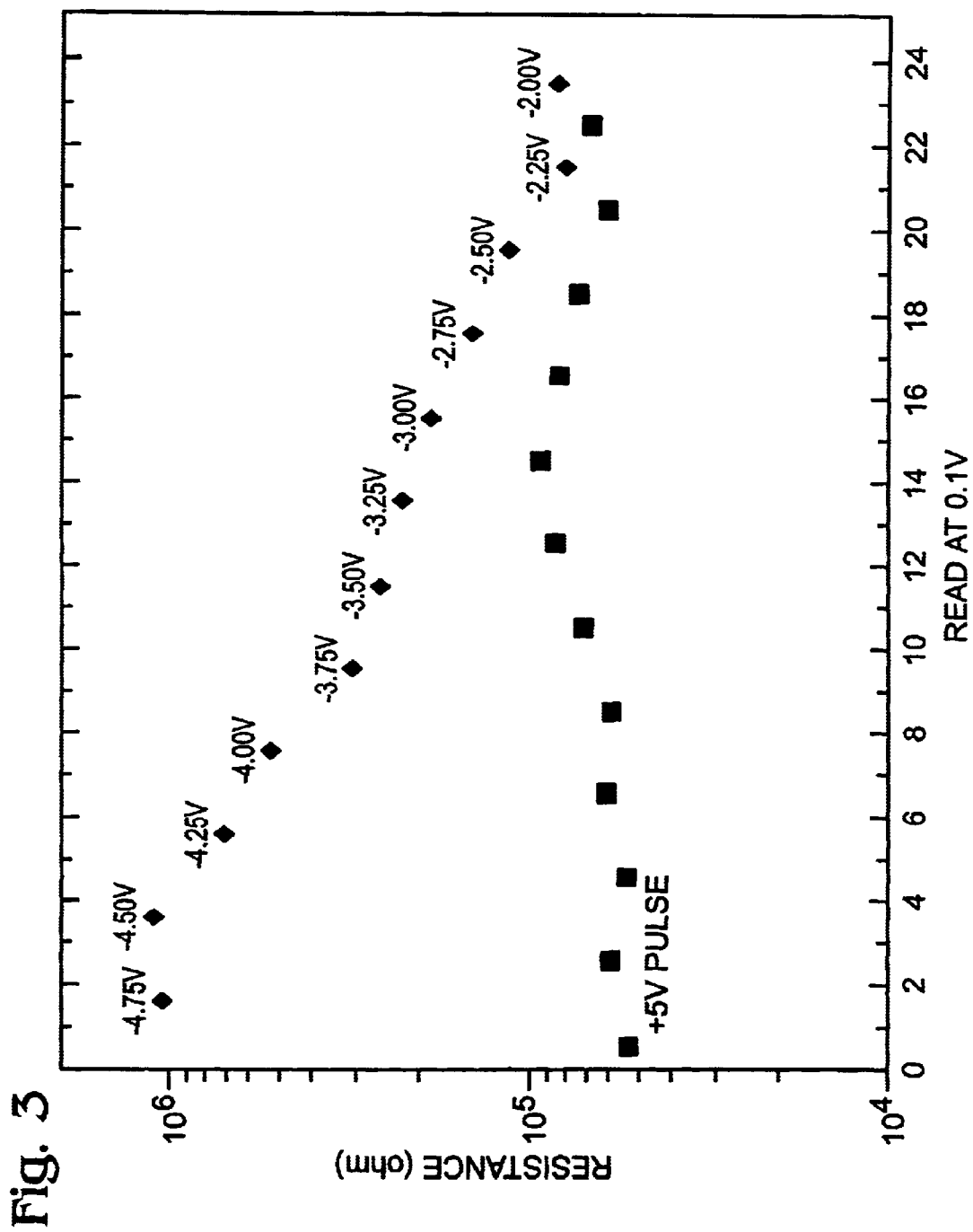
FIG. 3 depicts the reversible resistance change under electric pulse actions of a device constructed according to the method of the invention.

Reversible resistance change property measurement were carried out using a HP-4145B analyzer. The results are shown in FIGS. 2 and 3. As shown in FIG. 2, the resistance ranges from 3.65 MΩ to 8.61 MΩ when a −5V pulse was applied, and from 20.4 kΩ to 85.7 kΩ when a +5V pulse applied. In another group of experiments, the resistance changed gradually, or almost linearly decreased, with a decrease of magnitude of a negative electrical pulse, as depicted in FIG. 3. Both results demonstrate the resistance reversible change properties, and establish that multiple-level, spin-coated PCMO thin films may be used in non-volatile memory devices.

Thus, a method for resistance memory metal oxide thin film deposition has been disclosed. It will be appreciated that further variations and modifications thereof may be made within the scope of the invention as defined in the appended claims.

We claim:

1. A method of forming a perovskite precursor solution comprising:
    selecting a R-RAM metal oxide having the general formula: $M'_x M''_{(1-x)} M_y O_z$, wherein:
      M' is taken from the group of elements consisting of La, Ce, Pr, Nd, Pm, Sm Y, Sc, Yb, Lu, Gd;
      M" is taken from the group of elements consisting of Mg, Ca, Sr, Ba, Pb, Zn, Cd;
      M is taken from the group of elements consisting of Mn, Ce, V, Fe, Co, Nb, Ta, Cr, Mo, W, Zr, Hf, Ni;
      x has a range of between 0 to 1;
      y has a range of between 0 to 2; and
      z has a range of between 1 to 7; and
    selecting a metal acetate from a group of metal acetates having the genera formula of:
      $M^o(CH_3CO_2)_u$, where:
        $M^o$ is taken from the group of elements consisting of La, Ce, Pr, Nd, Pm,
        Sm Y, Sc, Yb, Lu, Gd, Mg, Ca, Sr, Ba, Pb, Zn, Cd, Mn, Ce, Fe, Co, Cr, Mo,
        Zr, Hf and Ni; and
        u has a range of between 2 to 4; and
      $M^o(CH_3CO_2)_v \cdot xH_2O$, where:
        $M^o$ is taken from the group of element consisting of La, Ce, Pr, Nd, Pm, Sm
        Y, Sc, Yb, Lu, Gd, Mg, Ca, Sr, Ba, Pb, Zn, Cd, Mn, Ce, Fe, Co, Cr, Mo, Zr,
        Hf and Ni; and
        v has a range of between 2 to 4; and
        x has a range of between 1 to 4;
    mixing solid precursor material into acetic acid forming a mixed solution;
    refluxing the mixed solution in air for between about one hour to six hours; and
    filtering the refluxed solution when cooled.

2. A method of forming a multi-layered, spin-coated perovskite thin film on a wafer, comprising:
    preparing a perovskite precursor solution, comprising:
      selecting a R-RAM metal oxide having the general formula: $M'_x M''_{(1-x)} M_y O_z$, wherein:
        M' is taken from the group of elements consisting of La, Ce, Pr, Nd, Pm, Sm Y, Sc, Yb, Lu, Gd;
        M" is taken from the group of elements consisting of Mg, Ca, Sr, Ba, Pb, Zn, Cd;
        M is taken from the group of elements consisting of Mn, Ce, V, Fe, Co, Nb, Ta, Cr, Mo, W, Zr, Hf, Ni;
        x has a range of between 0 to 1;
        y has a range of between 0 to 2; and
        z has a range of between 1 to 7; and
      selecting a metal acetate from a group of metal acetates having the general formula of:
        $M^o(CH_3CO_2)_u$, where:
          $M^o$ is taken from the group of elements consisting of La, Ce, Pr, Nd, Pm,
          Sm Y, Sc, Yb, Lu, Gd, Mg, Ca, Sr, Ba, Pb, Zn, Cd, Mn, Ce, Fe, Co, Cr, Mo,
          Zr, Hf and Ni; and
          u has a range of between 2 to 4; and
        $M^o(CH_3CO_2)_v \cdot xH_2O$, where:
          $M^o$ is taken from the group of element consisting of La, Ce, Pr, Nd, Pm, Sm
          Y, Sc, Yb, Lu, Gd, Mg, Ca, Sr, Ba, Pb, Zn, Cd, Mn, Ce, Fe, Co, Cr, Mo, Zr,
          Hf and Ni; and
          v has a range of between 2 to 4; and
          u has a range of between 1 to 4;
      mixing solid precursor material into acetic acid forming a mixed solution;
      refluxing the mixed solution in air for between about one hour to six hours; and filtering the refluxed solution when cooled;

placing a wafer in a spin-coating mechanism;
- spinning the wafer at a speed of between about 500 rpm to 3500 rpm;
- injecting the perovskite precursor solution onto the wafer surface;
- baking the coated wafer at a temperature of between about 100° C. to 300° C.;
- annealing the coated wafer at a temperature of between about 400° C. to 650° C. in an oxygen atmosphere for between about two minutes to ten minutes;
- repeating said spinning, injecting, baking and annealing steps until a perovskite layer of desired thickness is obtained; and
- annealing the perovskite coated wafer at a temperature of between about 500° C. to 750° C. in an oxygen atmosphere for between about ten minutes to two hours.

3. The method of claim 2 wherein said injecting includes injection a 0.5 N perovskite solution.

4. A method of forming a multi-layered, spin-coated PCMO thin film on a wafer, comprising:

preparing a PCMO precursor solution, comprising:
- dissolving $Pr(CH_3CO_2)_3 \cdot H_2O$, $Ca(CH_3CO_2)_2 \cdot H_2O$ and $Mn(III)(CH_3CO_2)_3 \cdot 2H_2O$ in acetic acid to form a mixed solution;
- refluxing the mixed solution in air for between about one hour and six hours; and
- filtering the refluxed solution when cooled;

placing a wafer in a spin-coating mechanism;
- spinning the wafer at a speed of between about 500 rpm to 3500 rpm;
- injecting the perovskite precursor solution onto the wafer surface;
- baking the coated wafer at a temperature of between about 100° C. to 300° C.;
- annealing the coated wafer at a temperature of between about 400° C. to 650° C. in an oxygen atmosphere for between about two minutes to ten minutes;
- repeating said spinning, injecting, baking and annealing steps until a perovskite layer of desired thickness is obtained; and
- annealing the perovskite coated wafer at a temperature of between about 500° C. to 750° C. in an oxygen atmosphere for between about ten minutes to two hours.

5. The method of claim 4 wherein said injecting includes injection 0.5 N PCMO solution.

\* \* \* \* \*